(12) United States Patent  
Danesh (10) Patent No.: US 7,612,702 B2  
(45) Date of Patent: Nov. 3, 2009

(54) ANALOG TO DIGITAL CONVERTER HAVING A NON-LINEAR RAMP VOLTAGE

(75) Inventor: Seyed Danesh, Edinburgh (GB)

(73) Assignee: STMicroelectronics (Research & Development) Limited, Marlow-Buckhinghamshire (GB)

( * ) Notice: Subject to any disclaimer, the term of this patent is extended or adjusted under 35 U.S.C. 154(b) by 0 days.

(21) Appl. No.: 11/780,738

(22) Filed: Jul. 20, 2007

(65) Prior Publication Data

US 2008/0042888 A1    Feb. 21, 2008

(30) Foreign Application Priority Data

Jul. 21, 2006    (EP) ................................... 06270072

(51) Int. Cl.  
*H03M 1/58* (2006.01)

(52) U.S. Cl. ...................................... 341/170; 341/155

(58) Field of Classification Search ................. 341/170, 341/164, 155, 120  
See application file for complete search history.

(56) References Cited

U.S. PATENT DOCUMENTS

| | | | |
|---|---|---|---|
| 4,381,495 A * | 4/1983 | Hotta et al. .................. | 341/120 |
| 5,119,347 A | 6/1992 | Portmann .................... | 368/113 |
| 5,920,274 A | 7/1999 | Gowda et al. ................ | 341/155 |
| 7,375,672 B2 * | 5/2008 | Muramatsu et al. ......... | 341/164 |
| 2002/0167611 A1 | 11/2002 | Boemler et al. ............. | 348/572 |

* cited by examiner

*Primary Examiner*—Jean B Jeanglaude  
*Assistant Examiner*—Joseph Lauture  
(74) *Attorney, Agent, or Firm*—Lisa K. Jorgenson; Allen, Dyer, Doppelt, Milbrath & Gilchrist, P.A.

(57) ABSTRACT

An analog to digital converter (ADC) includes a digital ramp generator, an analog voltage comparator, a digital to analog converter (DAC) and a data storage device. The digital ramp generator includes first and second counters. The counter outputs an incremental code to a second counter so that the output code of the second counter varies by the incremental code. The second counter outputs a digital ramp code to respective inputs of the DAC and the data storage device. The DAC outputs an analog voltage to an input of the analog voltage comparator which switches logic states when the output analog voltage of the DAC equals an input voltage received at the analog voltage comparator. The data storage device stores a code of the digital ramp code received at the data storage device at the switching of the logic state of the analog voltage comparator. The first counter varies the incremental code by an incremental step in response to a clock signal.

34 Claims, 6 Drawing Sheets

ANALOG TO DIGITAL CONVERTER HAVING A NON-LINEAR RAMP VOLTAGE

FIELD OF THE INVENTION

The invention relates to an analog to digital converter (ADC) having a non-linear ramp voltage for use in an image sensor. More particularly, but not exclusively, the invention relates to an ADC having a smooth non-linear ramp voltage for use in a complementary metal oxide semiconductor (CMOS) based image sensor.

BACKGROUND OF THE INVENTION

There are two types of commonly used image sensors, Charge Coupled Devices (CCDs) and (CMOS) sensors. Both CCD and CMOS image sensors convert photons into electrons via the interaction of photons with a semiconductor, typically silicon.

CCD sensors transfer charge within the silicon using electric fields and require high charge transfer efficiency (CTE), close to 100%. Consequently, the manufacturing of CCD sensor is tailored to maximize or increase the CTE associated with the device. This involves dopant implantations that result in the substrate being unsuitable for high performance transistor manufacture.

CMOS image sensors do not suffer the CTE issues of CCDs since the charge transfer generally takes place via metal tracks. Typically, the voltage output of a CMOS image sensor is indicative of the intensity of light falling upon it.

As CMOS image sensors are manufactured using either a standard CMOS process or a CMOS process engineered specifically for image sensing, it is common to implement a large amount of imaging signal processing on a sensing device. Typically, an ADC is implemented on the sensing device.

There are three ADC-CMOS sensor architectures that are commonly used in CMOS image sensors: a single ADC per sensing device; a single ADC per pixel column of the sensing device; and a single ADC per pixel of the sensing device. Each of these architectures has relative advantages and disadvantages associated with them that will be appreciated by those skilled in the art.

Figure 1:
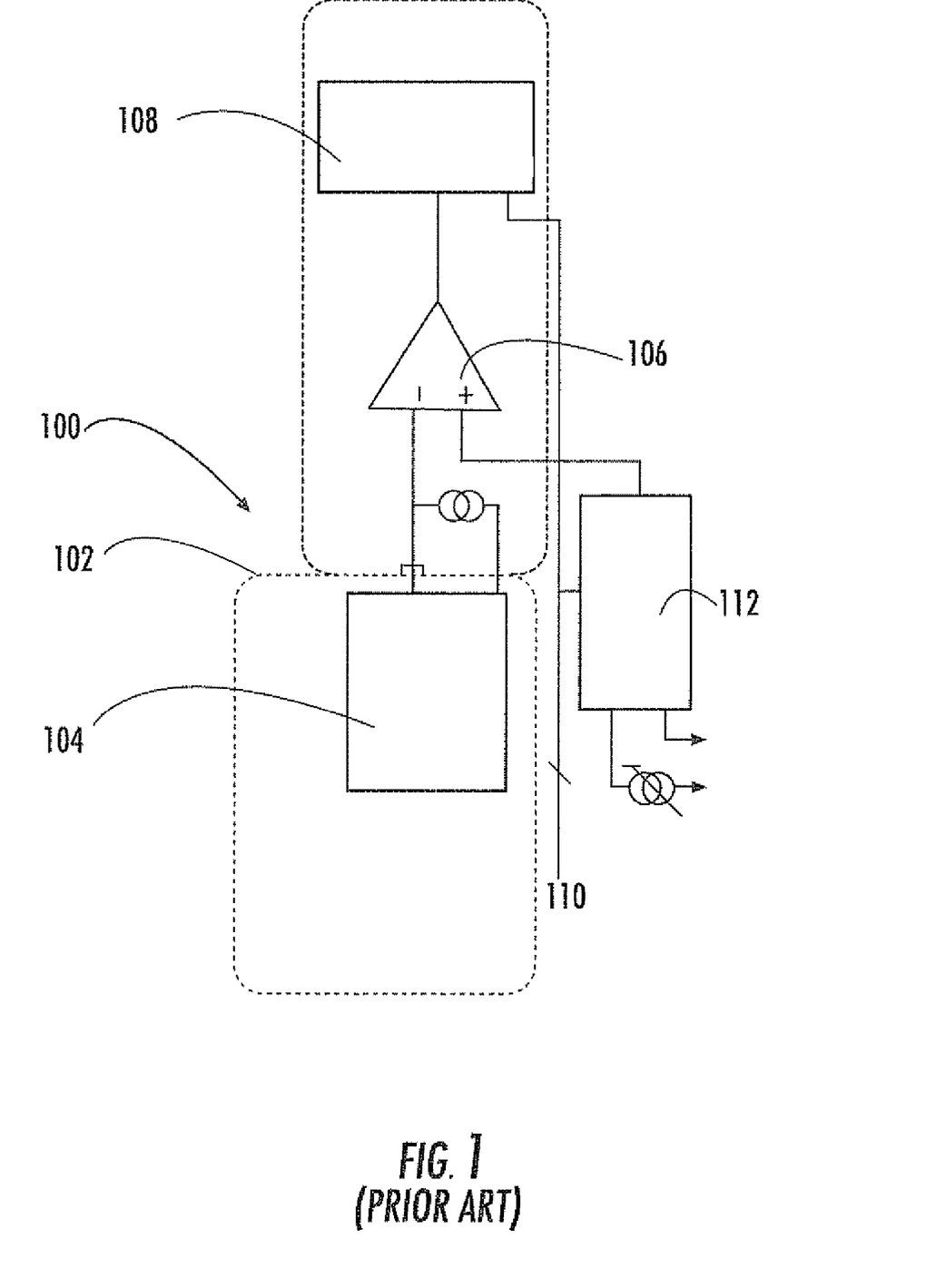
FIG. 1 is a circuit diagram of a column parallel sensor architecture according to the prior art.
Figure 2:
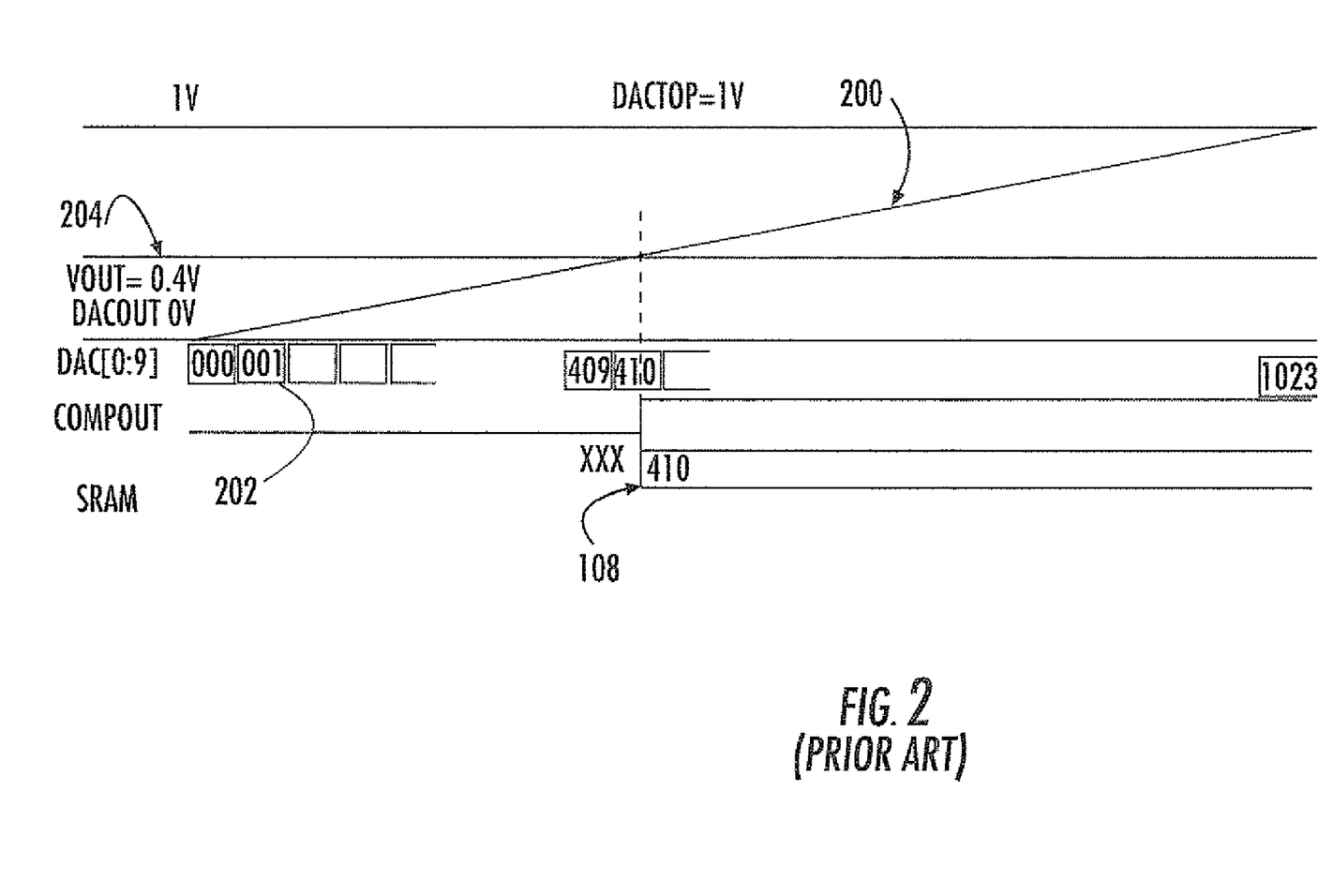
FIG. 2 is a signal diagram of an ADC conversion with a 1 Volt ramp and an input signal of 400 mV according to the prior art.
Figure 3:
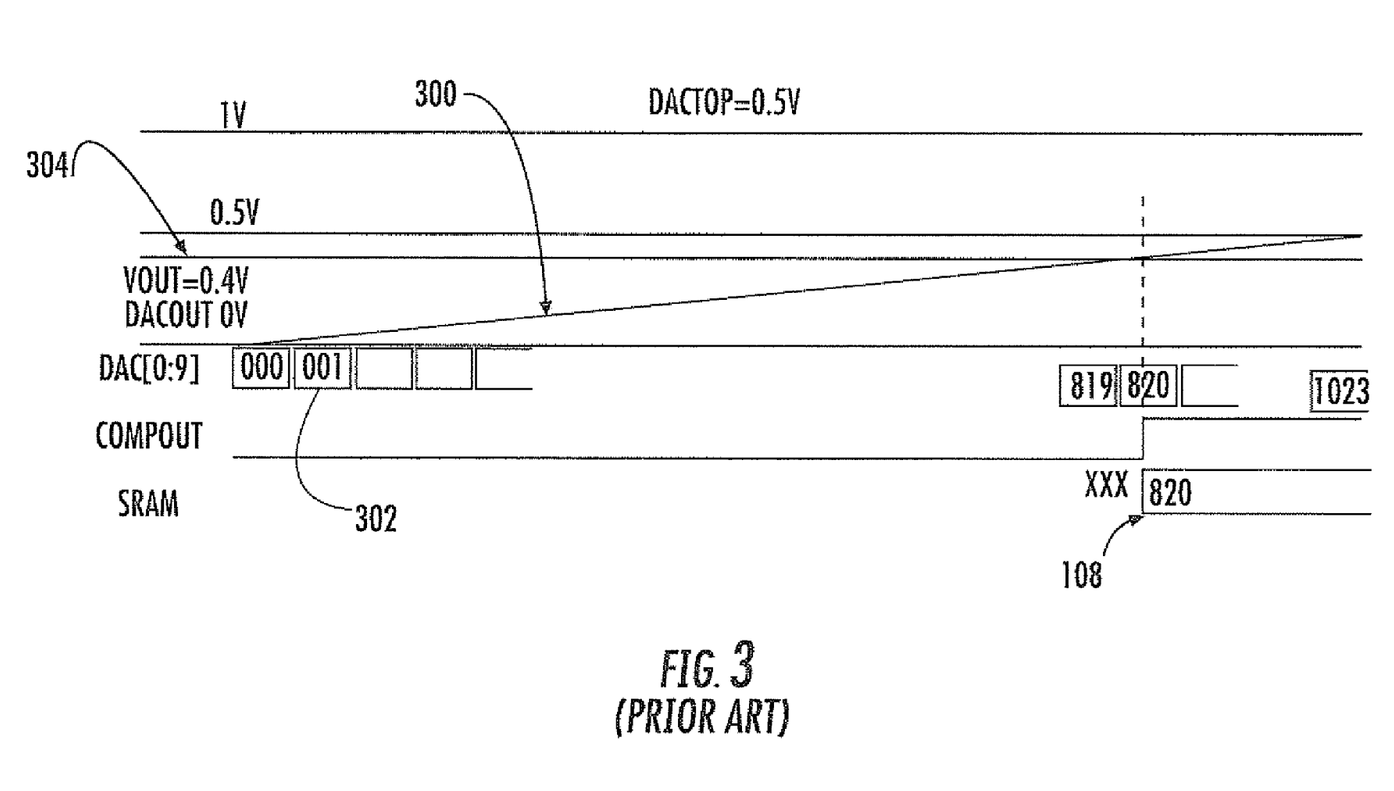
FIG. 3 is a signal diagram of an ADC conversion with a 500 mV ramp and an input signal of 400 mV according to the prior art.

Referring now to FIGS. 1 to 3, in an embodiment of a column parallel sensor architecture 100, each column 102 comprises pixels 104, an analog comparator 106, and a data storage device 108 which is typically an SRAM. A single digital analog converter (DAC) 110 provides a reference for the comparators of all columns of the architecture. This aids in reducing mismatch between the outputs of each column.

A further DAC 112 receives the input of the reference DAC 110 and outputs an increasing linear voltage ramp 200, 300 in response to a digital input sequence 202, 302. This voltage ramp 200, 300 feeds to both an input of the comparator 106 and to an input of the digital store 108. The other input of the comparator 106 receives an output voltage of the pixel 104 being sampled. When the ramp voltage 200, 300 equals the output voltage 204, 304 of the pixel 104, the comparator output changes from a logic low "0" to a logic high "1".

The output of the comparator 106 passes to the other input of the digital store 108 where a logic high triggers the digital store 108 to store the digital value received from the DAC 110. This stored value is indicative of the intensity of the light falling upon the pixel 104 being sampled.

Figure 4:
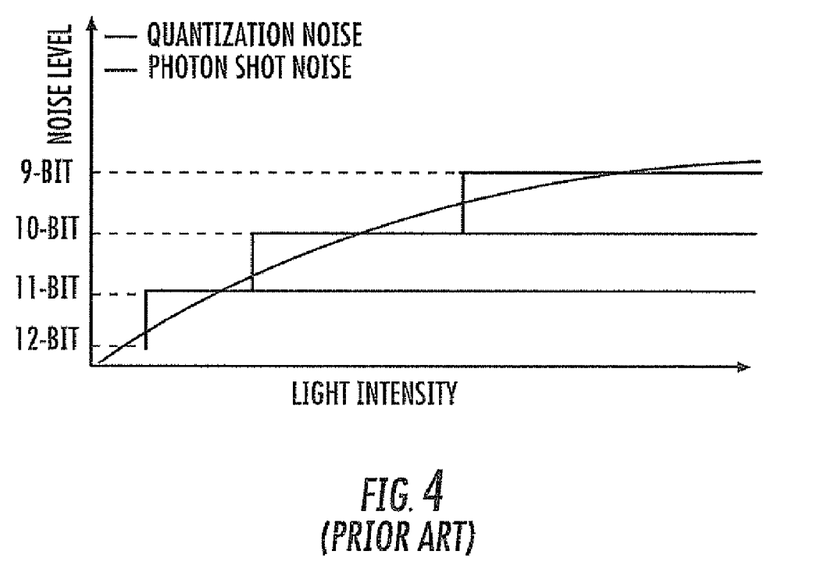
FIG. 4 is a graph of noise level of photon shot noise versus light intensity, and ADC quantization noise for various ADC resolutions according to the prior art.

FIG. 2 shows ADC conversion with 1 V total ramp voltage and input signal of 400 mV. FIG. 3 shows an ADC conversion with 500 mV total ramp voltage and an input signal of 400 mV. As the number of coding points is the same in both the examples of FIGS. 3 and 4, the gradient of the ramp of FIG. 4 is half that of FIG. 3. Consequently, the point at which the pixel output voltage is equal to that of the comparator occurs later in the cycle, and hence the value stored is increased. This results in differing intensity values.

Figure 6:
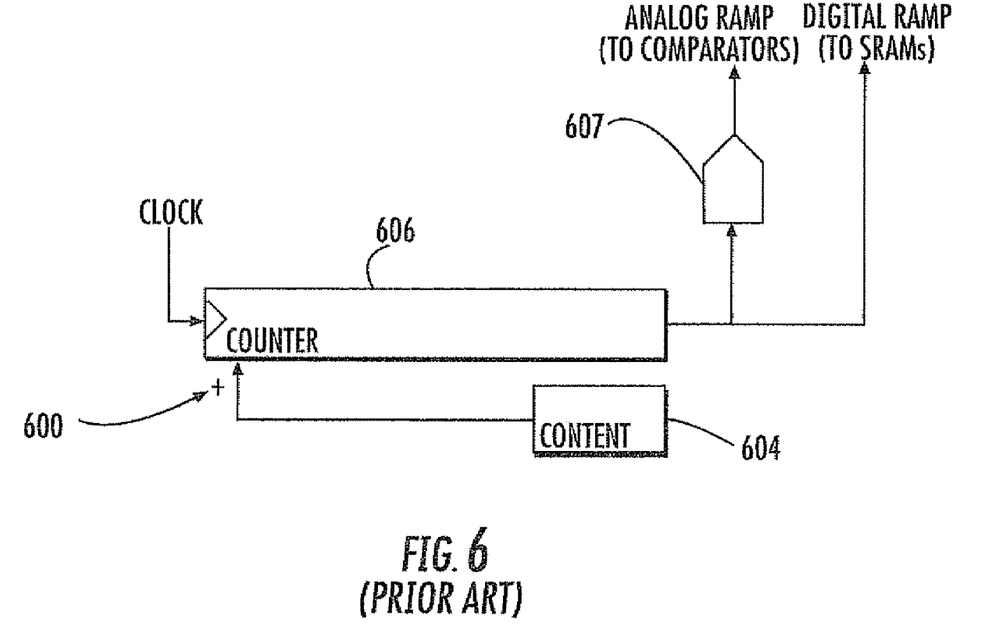
FIG. 6 is a schematic representation of a linear ramp code generator according to the prior art.

Referring now to FIG. 6, a linear digital ramp generator 600 comprises a memory device 604, a ramp counter 606 and a digital to analog converter (DAC) 607. In a preferred embodiment the counter 606 is a shift register.

The memory device 604 and the ramp counter 606 receive a clock signal from the same clock (not shown) at their respective clock inputs. Receipt of the clock signal triggers the ramp counter 606 to output a ramp code RAMP currently stored at the ramp counter 606.

Receipt of the clock signal triggers the memory device 604 to output a constant incremental code INC to the ramp counter 606. Upon receipt of the next clock pulse the ramp counter 606 outputs an updated ramp code that is the sum of the previous ramp code and the incremental code RAMP+INC.

Additionally, pixel photon shot noise is the dominant noise mechanism in CMOS image sensors when a pixel is subject to strong illumination as the number of photons detected varies due to the quantized nature of photons. This represents the upper limit of the signal to noise ratio (SNR) of a pixel at strong illuminations.

$$\sigma_{photon\text{-}shot} = \sqrt{N_{photons}} \quad \text{(Eq. 1)}$$

$\sigma_{photon\text{-}shot}$ is the photon shot noise contribution for an electron well with $N_{photons}$ electrons.

Strongly illuminated pixels have greater pixel photon shot noise than weakly illuminated ones in a non-linear relationship, such that the effect of photon shot noise is exacerbated at strong levels of illumination. This is shown in FIG. 4.

The resolution of an ADC can be fixed such that sensor performance is not compromised at low illumination levels. Typically, the SNR of weakly illuminated pixels is limited mainly by the quantization noise of the ADC as the contribution of photon shot noise to the total system noise is relatively small in this regime.

As the level of illumination incident upon a pixel increases, this relationship changes and photon shot noise dominates the total system noise. Current sensor arrangements exhibit a read-out rate that is limited by this fixed resolution of the ADC. This is because at higher illumination levels the quantization noise of the ADC is small compared to the photon shot noise.

It is known to use quasi-non-linear voltage ramps such as gamma correction, which is often used to compensate for non-linearity of a cathode ray tube (CRT). Typically, these non-linear ramps are either stored in a look up table or generated using an arithmetic logic unit (ALU).

Look up tables involve storing of a significant amount of data in a read only memory (ROM). The fabrication of a ROM on a device utilizes a significant amount of the device area. This either limits the amount of device area available for sensing applications, or will increase the size of the die with an attendant increase in the cost of the sensor. The fabrication of ROM on the device will increase the complexity of manufacture of the device, with the inherent increased risk of device failure.

Typically, an ALU occupies a significant area of the device area. Additionally, a typical ALU requires a significant amount of current to operate at high speeds.

Figure 5:
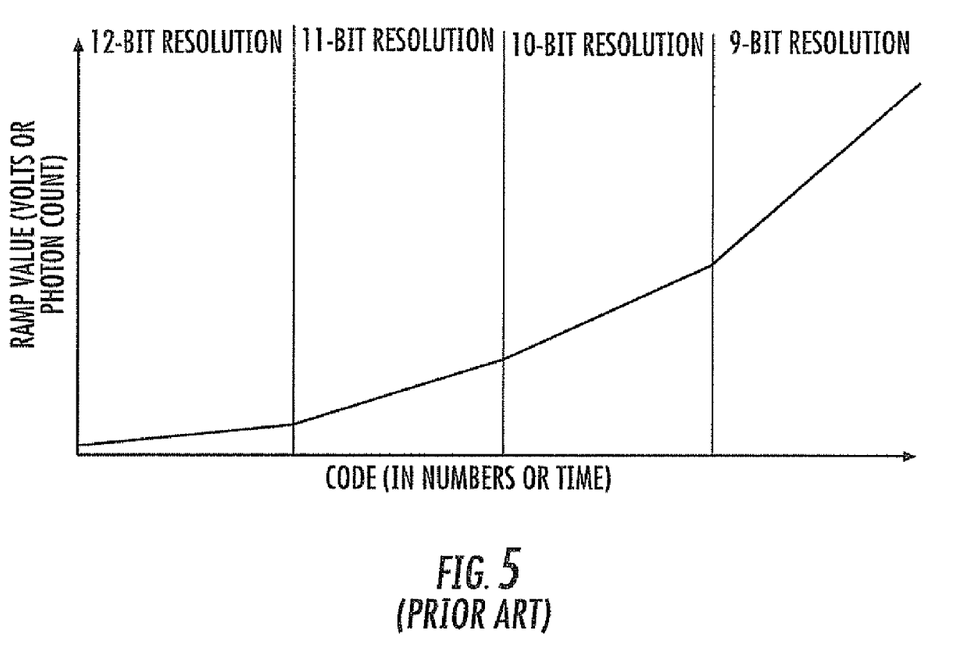
FIG. 5 is a graph of a ramp value of a linear ramp for a variable resolution ADC versus code according to the prior art.

An approximation to a quadratic voltage ramp can be achieved by subdividing quadratic voltage ramp into linear regions, each having a sequentially decreasing resolution, as shown in FIG. 5. This approach a number of disadvantages associated with it, for example, discontinuities exist at poles associated with the junctions between linear regions. These discontinuities introduce artifacts or distortions in images where the pixel output voltage corresponds closely to the coding value at which the discontinuity occurs.

SUMMARY OF THE INVENTION

According to a first aspect, an analog to digital converter (ADC) comprises a digital ramp generator, an analog voltage comparator, a digital to analog converter (DAC), and a data storage device. The digital ramp generator may comprise first and second counters. An output of the first counter may be arranged to output an incremental code to an input of the second counter upon receipt of a clock signal such that the output code of the second counter varies by the incremental code.

The second counter being arranged to output a digital ramp code to respective inputs of the DAC and the data storage device. The DAC may be arranged to output an analog voltage to a first input of the analog voltage comparator. The analog voltage comparator may be arranged to switch logic states when the output analog voltage of the DAC equals an input voltage received at a second input of the analog voltage comparator.

The data storage device may be arranged to store a code of the digital ramp code received at the data storage device at the switching of the logic state of the analog voltage comparator. The first counter may be arranged to vary the incremental code by an incremental step in response to a clock signal.

Such a DAC generates a non-linear ramp voltage without many additional components being required. This may reduce the complexity of manufacture as compared to prior art arrangements. It may also reduce the power consumption of the DAC compared to prior art arrangements for the production of non-linear ramps.

The DAC may comprise further data storage means or a memory to store data corresponding to the incremental step. The first counter may be arranged to read the data corresponding to the incremental step from the further storage means in response to the clock signal.

The incremental step may be varied between clock signals. The incremental step may be zero at a low digital ramp code, and typically for the first one hundred or less digital ramp codes generated, and preferably for the first fifty or less digital ramp codes generated. This overcomes the problem associated with ADC quantization noise dominating at low pixel illuminations.

Either or both of the first and second counters may comprise shift registers. Shift registers have the advantage that they do not take up a large area since, for example, no LUTs are required which means that it is inexpensive to produce. In addition, they have low power consumption. Furthermore, no gain adjustment is needed. This makes it simple to implement.

The ramp code may be continuously quadratic in form. A pure quadratic ramp does not have the corner problem which is present when using piecewise linear ramps, and unexpected artifacts or distortions should not appear in the image.

According to a second aspect, a digital ramp generator comprises first and second counters, and an output of the first counter may be arranged to output an incremental code to an input of the second counter upon receipt of a clock signal such that the output code of the second counter varies by the incremental code. The second counter may be arranged to output a digital ramp code. The first counter may be arranged to vary the incremental code by an incremental step in response to a clock signal.

According to a third aspect, an image sensor may comprise either or both of an ADC according to the first aspect or a digital ramp generator according to the second aspect.

According to a fourth aspect, a method of converting an analog voltage to a digital code comprises the steps of generating a digital ramp by outputting an incremental code from a first counter to an input of a second counter upon receipt of a clock signal such that the output code of the second counter varies by the incremental code. A digital ramp code may be output from the second counter to respective inputs of a DAC and a data storage device, and an analog voltage may be output from the DAC to a first input of an analog voltage comparator.

The method may further comprise switching logic states of the analog voltage comparator when the output analog voltage of the DAC equals an input voltage received at a second input of the analog voltage comparator, and storing a value of the digital ramp code received at the data storage device at the switching of the logic state of the analog voltage comparator at the data storage device. The incremental code output by the first counter may be varied by an incremental step in response to a clock signal.

According to fifth aspect, a method of generating a digital ramp code comprises the steps of outputting an incremental code from a first counter to an input of a second counter upon receipt of a clock signal, and varying an output digital ramp code of the second counter varies by the incremental code. The incremental code output by the first counter is varied by an incremental step in response to a clock signal.

BRIEF DESCRIPTION OF THE DRAWINGS

Embodiments of the invention and prior art will now be described, by way of example only, with reference to the accompanying drawings, in which.

DETAIL DESCRIPTION OF THE PREFERRED EMBODIMENTS

Figure 7:
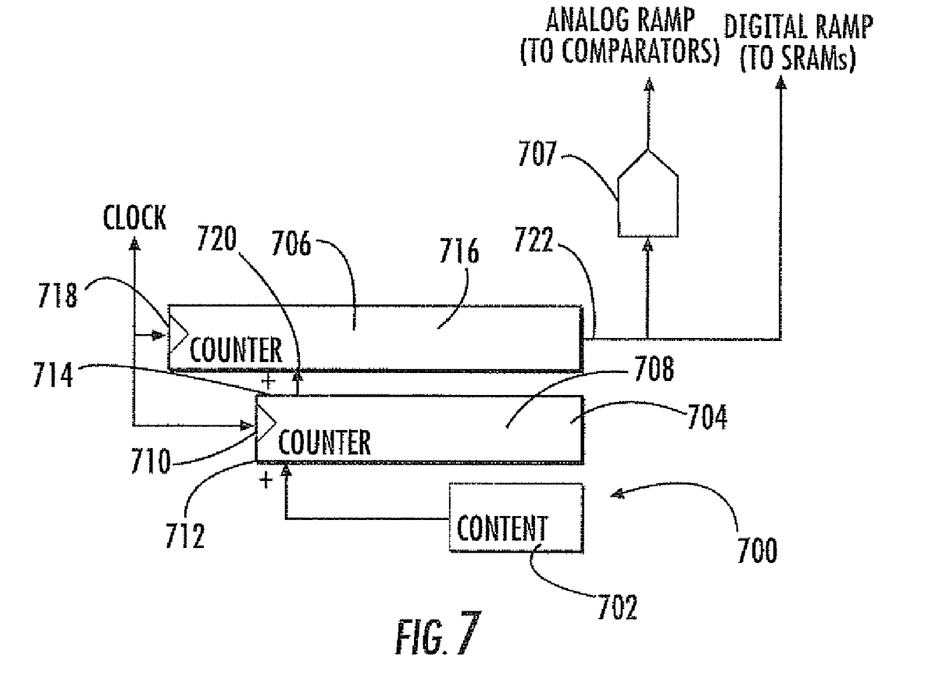
FIG. 7 is a schematic representation of a non-linear ramp code generator according to the present invention, also showing a DAC.

Referring now to FIG. 7, a non-linear, typically quadratic digital ramp generator 700 comprises a memory device 702, an incremental counter 704, a ramp counter 706, and a DAC 707. In a preferred embodiment, the counters 704, 706 are shift registers. The incremental counter 704 comprises a processor 708, a clock input 710, an additive input 712 and an output 714.

The ramp counter 706 comprises a processor 716, a clock input 718, an incremental input 720 and an output 722. The incremental counter 704 and the ramp counter 706 receive a clock signal from the same clock (not shown) at their respective clock inputs 710, 718. Receipt of the clock signal triggers the processor 716 of the ramp counter 706 to output a ramp code RAMP, currently stored at the ramp counter 706, to a DAC and a data storage device via the output 722.

Typically, the ramp counter will have an initial code of zero, although non-zero initial codes are possible. Receipt of the clock signal triggers the processor 708 of the incremental counter 704 to output an incremental code INC from the output 714 to the incremental input 720 of the ramp counter 706. The clock signal also triggers the processor 708 to read a stored incremental step code INC_STEP from the memory device 702, and to add this to the incremental code INC stored at the incremental counter 704.

Upon receipt of the next clock pulse the ramp counter 706 outputs an updated ramp code that is the sum of the previous ramp code and the incremental code RAMP+INC. The ramp counter 706 reads an updated incremental code INC+INC_STEP from the incremental counter 704 and adds this to the updated ramp code.

For example, the initial incremental code INC(0)=1, the incremental step is a predefined constant number INC_STEP=½ and the initial first ramp code RAMP(0)=1. RAMP(0) is incremented by INC(0), so RAMP(1)=2. Then IN(0) is incremented by INC_STEP, hence INC(1)=1.5. At the next clock pulse, RAMP(1) is incremented by INC(1), which is 1.5, so RAMP(2)=3.5. Typically, this process is repeated to produce a smooth quadratic digital ramp.

In a typical real implementation, INC_STEP is a digital code defined with reference to the pixel capacitance, gain and scaling of the system, an example of which is detailed below. Typically, such a ramp is quadratic in nature, and therefore, suitable for tracking pixel photon shot noise at stronger illuminations. However, at low illuminations ADC quantization noise is the dominant noise mechanism.

At any point the code of INC_STEP can be set to zero resulting in the creation of a linear ramp. The production of a linear ramp during the initial, low illumination, code period matches the ramp quantization noise to the read noise level.

At the leading edge of each clock pulse, the new code of ramp is presented to a DAC and then to a comparator (not shown), and also to an SRAM block (not shown) in the known manner described above with reference to FIG. 1.

Furthermore, following production of the ramp code, processing of pixel voltage data is executed in the standard manner described above with reference to FIG. 1. Typically, for a quadratic ramp that tracks photon shot noise when plotted with number of electrons versus code number, there is a ¼ scaling factor. This is used to calculate the maximum number of codes required to track photon shot noise accurately for any full well capacity.

Figure 8:
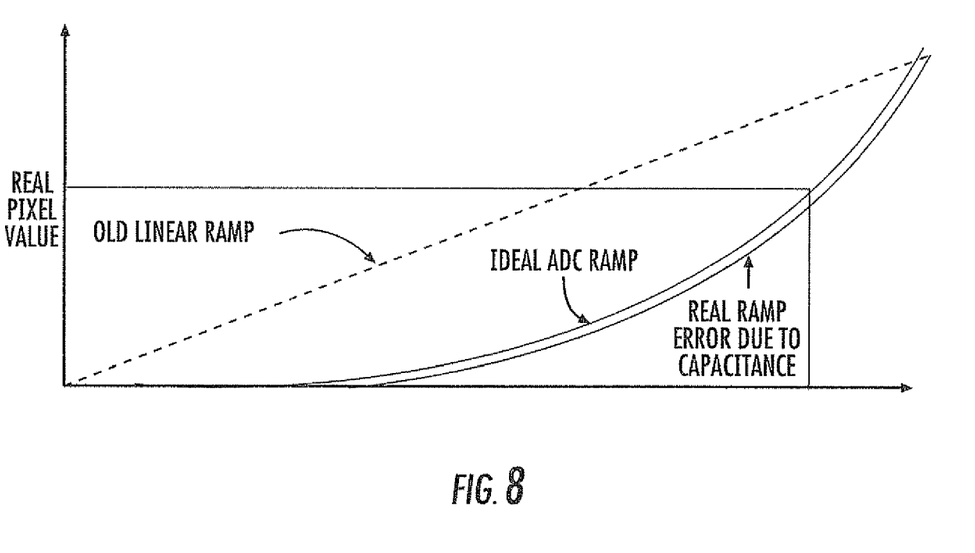
FIG. 8 is a graph showing the comparative ramp codings of a linear ramp generated by the prior art generator of FIG. 6, and an ideal quadratic ADC ramp and a quadratic ramp generated by the generator of FIG. 7.

FIG. 8 shows the relative intercept points of a linear ramp, an ideal theoretical ADC ramp and also a real quadratic ramp produced using the ramp generator 700 of FIG. 7. The real ramp is slightly offset from the theoretical curve due to a shift due to pixel capacitances and the capacitances of other components.

For example, if a pixel has a full well capacity of 13,000 electrons, then the minimum number of codes required can be calculated:

$$13000 = \frac{1}{4}x^2 \Rightarrow x^2 = 4 \times 13000 \Rightarrow x = 228 \quad \text{(Eq. 1)}$$

In an infinite resolution system a total of 228 codes are required to track the photon shot noise accurately. An infinite resolution system is one in which the ramp generator DAC and SRAM word have an infinite resolution.

A practical solution does not require infinite resolution. Rather, a system that can distinguish between one electron and zero electrons accurately is sufficient.

$$res = \log_2(\text{full-well}) \quad \text{(Eq. 3)}$$

For the example above, a 14 bit system is required and with 228 correctly chosen codes all the available information obtainable from the pixel can be digitized. A typical ramp voltage to code relationship is derived as follows:

$$V = \frac{Q}{C} = \frac{y \times q}{C_{pix}} \quad \text{(Eq. 3)}$$

$$V = (G \times S) \frac{C_{pix}}{4q} x^2$$

q is the charge of one electron equal to $1.6 \times 10^{-19}$,
$C_{pix}$ is the pixel capacitance,
G is the gain of the system from the pixel voltage to the input of the ADC, and
S is the scaling factor.

However, with the aid of this system the clock rate of the imaging apparatus can be reduced while maintaining a desirable frame readout rate. It will be appreciated that an ADC as described above can be incorporated into a CMOS image sensor.

It will be further appreciated that a CMOS image sensor comprising an ADC as described above can be incorporated into a device selected from the following, non-exhaustive list: digital stills camera, digital video cameras, microscopes, endoscopes, mobile telephones, optical mousses ice, and X-ray sensors.

It will be appreciated that the term "increment" is used herein to describe increasing a value and also decreasing a value. Accordingly, it will be appreciated that references to "increment" may also encompass "decrement" in an alternative embodiment. Alterations and modifications may be made to the above without departing from the scope of the invention.

That which is claimed:

1. An analog to digital converter comprising:
   a digital to analog converter for outputting an analog voltage;
   a data storage device;
   a digital ramp generator comprising
      a first counter for outputting an incremental code based upon a clock signal, said first counter varying the incremental code by an incremental step based upon the clock signal, and
      a second counter for receiving the incremental code from said first counter, and for outputting a digital ramp code that varies based on the incremental code, the digital ramp code being provided to respective inputs of said digital to analog converter and to said data storage device;

an analog voltage comparator having a first input for receiving the analog voltage from said digital to analog converter, and a second input for receiving an input voltage, said analog voltage comparator switching logic states when the analog voltage received at the first input equals the input voltage received at the second input; and said data storage device for storing the digital ramp code at the switching of the logic state of said analog voltage comparator.

2. An analog to digital converter according to claim 1 further comprising a memory for storing data corresponding to the incremental step.

3. An analog to digital converter according to claim 2 wherein said first counter reads the data corresponding to the incremental step from said memory based upon the clock signal.

4. An analog to digital converter according to claim 1 wherein the incremental step is varied between clock pulses.

5. An analog to digital converter according to claim 1 wherein the incremental step is zero for the first one hundred or less digital ramp codes generated.

6. An analog to digital converter according to claim 5 wherein the incremental step is zero for the first fifty or less digital ramp codes generated.

7. An analog to digital converter according to claim 1 wherein at least one of said first and second counters comprises a shift register.

8. A digital ramp generator comprising:

a first counter for outputting an incremental code based upon a clock signal, said first counter varying the incremental code by an incremental step based upon a clock signal; and a second counter for receiving the incremental code from said first counter, and for outputting a digital ramp code that non-linearly varies based on the incremental code so that the digital ramp code approximates a quadratic function.

9. A digital ramp generator according to claim 8 wherein the incremental step is varied between clock signals.

10. A digital ramp generator according to claim 8 wherein at least one of said first and second counters comprises a shift register.

11. A digital ramp generator according to claim 8 further comprising a memory for storing data corresponding to the incremental step.

12. A digital ramp generator according to claim 11 wherein said first counter reads the data corresponding to the incremental step from said memory based upon the clock signal.

13. An image sensor comprising
at least one pixel; and
at least one analog to digital converter coupled to said at least one pixel, and comprising
a digital to analog converter for outputting an analog voltage,
a data storage device,
a digital ramp generator comprising
a first counter for outputting an incremental code based upon a clock signal, said first counter varying the incremental code by an incremental step based upon the clock signal, and
a second counter for receiving the incremental code from said first counter, and for outputting a digital ramp code that varies based on the incremental code, the digital ramp code being provided to respective inputs of said digital to analog converter and to said data storage device, and
an analog voltage comparator having a first input for receiving the analog voltage from said digital to analog converter, and a second input for receiving an input voltage, said analog voltage comparator switching logic states when the analog voltage received at the first input equals the input voltage received at the second input.

14. An image sensor according to claim 13 wherein said data storage device is for storing the digital ramp code at the switching of the logic state of said analog voltage comparator.

15. An image sensor according to claim 13 wherein said at least one pixel and said analog to digital converter are configured so that the image sensor comprises a CMOS image sensor.

16. An image sensor according to claim 13 wherein said analog to digital converter generates non-linear quantization steps.

17. An image sensor according to claim 16 wherein the non-linear quantization steps vary in accordance with a signal level received from a sensing element.

18. An image sensor according to claim 16 wherein the non-linear quantization steps approximate a quadratic function.

19. An image sensor according to claim 16 wherein the non-linear quantization steps are generated by repetitious non-linear incremental addition to a preceding quantization step value.

20. An image sensor according to claim 13 further comprising a memory for storing data corresponding to the incremental step, and wherein said first counter reads the data corresponding to the incremental step from said memory based upon the clock signal.

21. An image sensor according to claim 13 wherein the incremental step is varied between clock pulses.

22. An image sensor according to claim 13 wherein the incremental step is zero for the first one hundred or less digital ramp codes generated.

23. An image sensor according to claim 13 wherein at least one of said first and second counters comprises a shift register.

24. An image sensor according to claim 13 wherein said at least one pixel provides an output to said at least one analog to digital converter so that the image sensor is configured as a column based image sensor.

25. An image sensor according to claim 13 wherein said at least one pixel and said at least one analog to digital converter are configured so that the image sensor is incorporated into at least one of the following: a digital still camera, a digital video camera, a microscope, an endoscope, a mobile telephone, an optical mouse, and an X-ray-sensor.

26. A method of converting an analog voltage to a digital code comprising:

outputting an incremental code from a first counter based upon a clock signal, the first counter varying the incremental code by an incremental step based upon the clock signal;

providing the incremental code to an input of a second counter, the second counter outputting a digital ramp code that varies based on the incremental code, the digital ramp code being provided to respective inputs of a digital to analog converter and to a data storage device;

providing an analog voltage from the digital to analog converter to a first input of an analog voltage comparator, providing an input voltage to a second input of the analog voltage comparator, and switching logic states of the analog voltage comparator when the analog voltage received at the first input equals the input voltage received at the second input; and storing the digital ramp code in the data storage device at the switching of the logic state of the analog voltage comparator.

27. A method according to claim 26 further comprising storing data corresponding to the incremental step in a memory, and wherein the first counter reads the data corresponding to the incremental step from the memory based upon the clock signal.

28. A method according to claim 26 wherein the incremental step is varied between clock pulses.

29. A method according to claim 26 wherein the incremental step is zero for the first one hundred or less digital ramp codes generated.

30. A method according to claim 26 wherein at least one of the first and second counters comprises a shift register.

31. A digital ramp code generation method comprising:

outputting an incremental code from a first counter based upon a clock signal, the first counter varying the incremental code by an incremental step based upon the clock signal; and providing the incremental code to an input of a second counter, the second counter outputting a digital ramp code that non-linearly varies based on the incremental code so that the digital ramp code approximates a quadratic function.

32. A method according to claim 31 wherein the incremental step is varied between clock signals.

33. A method according to claim 31 further comprising storing data corresponding to the incremental step in a memory.

34. A method according to claim 33 wherein the first counter reads the data corresponding to the incremental step from the memory based upon the clock signal.

* * * * *